United States Patent
Sato et al.

(10) Patent No.: US 9,337,165 B2
(45) Date of Patent: May 10, 2016

(54) METHOD FOR MANUFACTURING A FAN-OUT WLP WITH PACKAGE

(71) Applicant: Tessera, Inc., San Jose, CA (US)

(72) Inventors: Hiroaki Sato, Yokohama (JP); Kiyoaki Hashimoto, Yokohama (JP); Yoshikuni Nakadaira, Yokohama (JP); Norihito Masuda, Yokohama (JP); Belgacem Haba, Saratoga, CA (US); Ilyas Mohammed, Santa Clara, CA (US); Philip Damberg, Cupertino, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 14/525,462

(22) Filed: Oct. 28, 2014

(65) Prior Publication Data
US 2015/0044824 A1 Feb. 12, 2015

Related U.S. Application Data

(62) Division of application No. 13/155,719, filed on Jun. 8, 2011, now Pat. No. 8,890,304.

(51) Int. Cl.
*H01L 21/44* (2006.01)
*H01L 23/00* (2006.01)
(Continued)

(52) U.S. Cl.
CPC .............. *H01L 24/83* (2013.01); *H01L 21/561* (2013.01); *H01L 21/563* (2013.01); *H01L 23/13* (2013.01); *H01L 23/3128* (2013.01); *H01L 23/49816* (2013.01); *H01L 23/49827* (2013.01); *H01L 24/03* (2013.01); *H01L 24/19* (2013.01); *H01L 24/20* (2013.01); *H01L 24/24* (2013.01); *H01L 24/73* (2013.01); *H01L 24/82* (2013.01); *H01L 24/96* (2013.01); *H01L 24/32* (2013.01); *H01L 2224/0231* (2013.01); *H01L 2224/0401* (2013.01); *H01L 2224/04105* (2013.01); *H01L 2224/12105* (2013.01); *H01L 2224/215* (2013.01); *H01L 2224/245* (2013.01); *H01L 2224/24011* (2013.01); *H01L 2224/24225* (2013.01); *H01L 2224/32225* (2013.01); *H01L 2224/73217* (2013.01); *H01L 2224/76155* (2013.01); *H01L 2224/8284* (2013.01); *H01L 2224/82101* (2013.01); *H01L 2224/82102* (2013.01); *H01L 2224/82103* (2013.01); *H01L 2224/82104* (2013.01); *H01L 2224/83053* (2013.01); *H01L 2224/8384* (2013.01); *H01L 2224/83091* (2013.01);

(Continued)

(58) Field of Classification Search
CPC ............ H01L 21/76898; H01L 23/481; H01L 25/0657; H01L 2225/06541
See application file for complete search history.

(56) References Cited

U.S. PATENT DOCUMENTS

| | | | |
|---|---|---|---|
| 5,148,265 | A | 9/1992 | Khandros et al. |
| 5,148,266 | A | 9/1992 | Khandros et al. |

(Continued)

OTHER PUBLICATIONS

U.S. Appl. No. 13/092,376.

*Primary Examiner* — Hoai V Pham
(74) *Attorney, Agent, or Firm* — Lerner, David, Littenberg, Krumholz & Mentlik, LLP

(57) ABSTRACT

The present disclosure is directed to a method for making a microelectronic package that includes assembling a microelectronic unit with a substrate, and electrically connecting redistribution contacts on the microelectronic unit and terminals on the substrate with a conductive matrix material extending within at least one opening extending through the substrate.

17 Claims, 7 Drawing Sheets

(51) Int. Cl.
*H01L 21/56* (2006.01)
*H01L 23/13* (2006.01)
*H01L 23/31* (2006.01)
*H01L 23/498* (2006.01)

(52) U.S. Cl.
CPC ........ *H01L 2224/83851* (2013.01); *H01L 2224/83862* (2013.01); *H01L 2924/014* (2013.01); *H01L 2924/01005* (2013.01); *H01L 2924/01006* (2013.01); *H01L 2924/01013* (2013.01); *H01L 2924/01029* (2013.01); *H01L 2924/01033* (2013.01); *H01L 2924/01047* (2013.01); *H01L 2924/01075* (2013.01); *H01L 2924/01079* (2013.01); *H01L 2924/01082* (2013.01); *H01L 2924/01327* (2013.01); *H01L 2924/06* (2013.01); *H01L 2924/09701* (2013.01); *H01L 2924/12042* (2013.01); *H01L 2924/15151* (2013.01); *H01L 2924/15311* (2013.01); *H01L 2924/181* (2013.01)

(56) References Cited

U.S. PATENT DOCUMENTS

| | | |
|---|---|---|
| 5,679,977 A | 10/1997 | Khandros et al. |
| 2008/0124843 A1 | 5/2008 | Ohuchi et al. |
| 2009/0261466 A1 | 10/2009 | Pagaila et al. |
| 2010/0232129 A1 | 9/2010 | Haba et al. |
| 2011/0278717 A1* | 11/2011 | Pagaila .......... H01L 21/568 257/737 |

\* cited by examiner

METHOD FOR MANUFACTURING A FAN-OUT WLP WITH PACKAGE

CROSS-REFERENCES TO RELATED APPLICATIONS

The present application is a divisional application of U.S. patent application Ser. No. 13/155,719, filed on Jun. 8, 2011, the disclosure of which is hereby incorporated herein by reference.

BACKGROUND OF THE INVENTION

The present invention relates to stacked microelectronic assemblies and methods of making such assemblies, and to components useful in such assemblies.

Semiconductor chips are commonly provided as individual, prepackaged units. A standard chip has a flat, rectangular body with a large front face having contacts connected to the internal circuitry of the chip. Each individual chip typically is mounted in a package which, in turn, is mounted on a circuit panel such as a printed circuit board and which connects the contacts of the chip to conductors of the circuit panel. In many conventional designs, the chip package occupies an area of the circuit panel considerably larger than the area of the chip itself. As used in this disclosure with reference to a flat chip having a front face, the "area of the chip" should be understood as referring to the area of the front face. In "flip chip" designs, the front face of the chip confronts the face of a package substrate, i.e., chip carrier and the contacts on the chip are bonded directly to contacts of the chip carrier by solder balls or other connecting elements. In turn, the chip carrier can be bonded to a circuit panel through terminals overlying the front face of the chip. The "flip chip" design provides a relatively compact arrangement; each chip occupies an area of the circuit panel equal to or slightly larger than the area of the chip's front face, such as disclosed, for example, in certain embodiments of commonly-assigned U.S. Pat. Nos. 5,148,265; 5,148,266; and 5,679,977, the disclosures of which are incorporated herein by reference.

Certain innovative mounting techniques offer compactness approaching or equal to that of conventional flip-chip bonding. Packages which can accommodate a single chip in an area of the circuit panel equal to or slightly larger than the area of the chip itself are commonly referred to as "chip-sized packages."

In addition to minimizing the planar area of the circuit panel occupied by microelectronic assembly, it is also desirable to produce a chip package that presents a low, overall height or dimension perpendicular to the plane of the circuit panel. Such thin microelectronic packages allow for placement of a circuit panel having the packages mounted therein in close proximity to neighboring structures, thus reducing the overall size of the product incorporating the circuit panel. There are, however, applications in which a relatively larger package is desired. These include instances in which a larger microelectronic element is to be packaged and in which a large fan-out area is needed to achieve connection to a larger array on a printed circuit board or the like. Many wafer-level packages present reliability issued in such relatively larger sizes due to an inherent increase in the effects of varying coefficients of thermal expansion among the components of the package. Such effects can also be visible in relatively smaller applications, particularly when contacts are placed in certain locations and when the package undergoes frequent heat-cycling.

Accordingly, further improvements would be desirable in the area of wafer-level packages or similar structures.

SUMMARY OF THE INVENTION

An embodiment of the present disclosure relates to a microelectronic package including a microelectronic unit and a substrate. The microelectronic unit includes a microelectronic element having a front face, edges bounding the front face, and contacts on the front face. The microelectronic unit further includes a dielectric material having a first surface substantially flush with the front face of the microelectronic element and extending away from the edges thereof. Conductive traces have at least portions extending along the front face away from the contacts, and at least some of the traces also extend along the first surface of the dielectric material. Conductive redistribution contacts are connected with the traces, and at least some of the contacts are disposed at the first surface of the dielectric material. The substrate has first and second opposed surfaces and an edge extending therebetween, the first surface facing the front face of the microelectronic unit, and the second surface having a plurality of terminals thereon configured for electrical connection with at least one external component. Masses of conductive matrix material join the terminals with the redistribution contacts.

The microelectronic element can be a first microelectronic element, and the microelectronic unit can further include a second microelectronic element having a front face, edges bounding the front face, and contacts on the first face. The conductive traces can extend from contacts on each of the first and second microelectronic elements.

The substrate can further include a plurality of conductive elements that are at least part of an electrical connection between the contacts of the first microelectronic element and the contacts of the second microelectronic element. The terminals of the substrate can be first terminals electrically interconnected with the contacts of the first microelectronic element, and the substrate can further include second terminals electrically interconnected with the contacts of the second microelectronic element. The conductive elements of the substrate can be conductive traces that extend along the second surface of the substrate between at least some of the first terminals and respective ones of at least some of the second terminals.

The edge of the substrate can be a peripheral edge. Alternatively, the substrate can include an aperture extending between the first and second surfaces such that the edge is defined by the aperture. In such an embodiment, the conductive interconnects can extend through the aperture along portions of the edge. The conductive interconnects can have first ends bonded to respective ones of the redistribution contacts and second ends bonded to conductive elements formed along the second surface of the substrate. The conductive elements can be connected with the terminals. The edge can form an angle with the second surface of the substrate, the angle being between about 25° and 50°.

The substrate can further include conductive interconnects extending in a direction between the first and second surfaces of the substrate, and the terminals can be electrically connected with the redistribution contacts through the conductive interconnects. In an embodiment the terminals can include a solid metal post portion that extends at least partially through the substrate to an end surface located between the first and second surfaces of the substrate. The conductive masses can include a sintered material matrix. The sintered material matrix can include a high melt point metal, a low melt point metal, and a reactive polymer. The high melt point metal can be copper, and the low melt point metal can be one of Tin, Bismuth, or a combination thereof. The sintering matrix can further include a fluxing component.

In an embodiment, the substrate can include an element having a coefficient of thermal expansion of less than parts per million per degree Celsius ("ppm/° C."). Additionally or alternatively, the substrate can include a compliant dielectric layer. The package can further include an underfill layer between a common surface including the front surface of the microelectronic element and the first surface of the dielectric layer and the first surface of the substrate.

A microelectronic assembly can include a microelectronic package as described above. The assembly can further include a circuit panel having a plurality of circuit contacts thereon. Conductive masses can join the terminals of the substrate with respective ones of the circuit contacts.

A system comprising can include a microelectronic assembly as described above and one or more other electronic components electrically connected to the microelectronic assembly.

A further embodiment of the present disclosure relates to a method for making a microelectronic package. The method includes providing a substrate having first and second opposed surfaces and an edge extending therebetween. The second face has a plurality of terminals thereon configured for electrical connection with at least one external component. The substrate further has at least one opening extending therethrough between the first and second surfaces. The method further includes mounting a microelectronic unit on the substrate. The microelectronic unit includes a microelectronic element having a front face with contacts thereon and edges bounding the front face and a dielectric layer having a first surface substantially flush with the front face and extending away from the edges. Conductive traces have portions extending along the front face away from the contacts, at least some of which further extend along the first surface of the dielectric layer. Conductive redistribution contacts are connected with the traces, at least some of which are disposed on the first surface of the dielectric layer. The method also includes depositing a conductive matrix material into the at least one opening in the substrate such that an electrical connection is completed between the redistribution contacts and the terminals. The method can further include forming the openings extending through the substrate after mounting the microelectronic unit on the substrate.

An alternative method for making a microelectronic package includes providing a substrate having first and second opposed surfaces and an edge extending therebetween. The second face has a plurality of terminals thereon configured for electrical connection with at least one external component. The substrate further has conductive interconnects extending between the first and second surfaces thereof and connected with the terminals. A microelectronic unit is mounted on the substrate. The microelectronic unit includes a microelectronic element having a front face with contacts thereon and edges bounding the front face and a dielectric layer having a first surface substantially flush with the front face and extending away from the edges. The microelectronic unit also includes conductive traces having portions extending along the front face away from the contacts, at least some of which further extend along the first surface of the dielectric layer. Conductive redistribution contacts are connected with the traces, at least some of which are disposed on the first surface of the dielectric layer. Mounting the microelectronic unit on the substrate is carried out such that an electrical connection is completed between the redistribution contacts and the terminals.

The step of providing the substrate can further include forming a plurality of apertures through the substrate, the edge of the substrate being an edge of one of the apertures. The conductive interconnects can then be formed within respective ones of the apertures. The conductive interconnects can be rigid metal structures, and the microelectronic unit can be mounted to the substrate using masses of conductive bonding material that is part of an electrical connection between the redistribution contacts and the terminals. The method can further include forming an underfill layer between the front surface of the microelectronic unit and the first surface of the substrate.

In either of the methods, the conductive interconnects can be made from a conductive bonding material, and the step of mounting the microelectronic unit on the substrate can include joining the conductive interconnects to the redistribution contacts, thereby completing the connection between the redistribution contacts and the terminals. The conductive bonding material can be a conductive matrix material and the interconnects can be joined to the redistribution contacts by heating the interconnects. The conductive bonding material can be a sintered matrix with suspended conductive particles, and the interconnects can be joined to the redistribution contacts by heating the interconnects. The conductive particles can have a melting temperature, and the interconnects can be heated to above the melting temperature to re-flow the conductive particles.

BRIEF DESCRIPTION OF THE DRAWINGS

Various embodiments of the present invention will be now described with reference to the appended drawings. It is appreciated that these drawings depict only some embodiments of the invention and are therefore not to be considered limiting of its scope.

DETAILED DESCRIPTION

Figure 1:
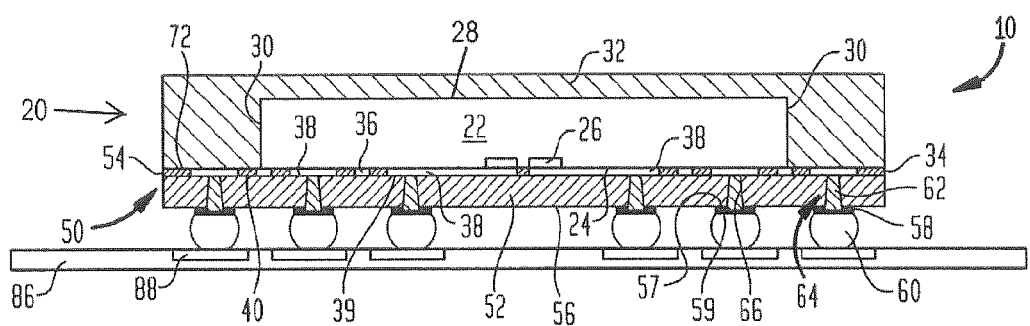
FIG. 1 shows a microelectronic package according to an embodiment of the present disclosure assembled on a circuit panel.

Turning now to the Figures where similar numeric references are used to represent similar features, FIG. 1 shows a microelectronic package 10 according to an embodiment of the present disclosure. Microelectronic package 10 includes a microelectronic unit 20 mounted on a substrate 50. Microelectronic unit 20 has a structure referred to as a wafer-level package and can be a fan-out wafer level package and can further be a reconstituted wafer level package, as described below.

Microelectronic unit 20 includes a microelectronic element 22. The microelectronic element 22 has a front face 24, a rear face 28 remote therefrom, and edges 30 extending between the front 24 and rear 28 faces. Electrical contacts 26 are exposed at the front face 24 of the microelectronic element 22. As used in this disclosure, a statement that an electrically conductive element is "exposed at" a surface of a structure indicates that the electrically conductive element is available for contact with a theoretical point moving in a direction perpendicular to the surface toward the surface from outside the structure. Thus, a terminal or other conductive element which is exposed at a surface of a structure may project from such surface; may be flush with such surface; or may be recessed relative to such surface and exposed through a hole or depression in the structure.

A dielectric layer 32 overlies rear face 28 of microelectronic element 22 and can further overlie a portion of edges 30 and extend outward therefrom away from edges 30 to form a first surface 34 that is substantially coplanar with front face 24 of microelectronic element 22. Dielectric layer 32 can be formed from a dielectric material with insulating properties such as silicon dioxide, polyimide, epoxy resin or other materials that are described in U.S. Patent App. Pub. No. 2010/0232129, which is incorporated by reference herein in its entirety.

Redistribution circuitry is formed along a common surface 40 defined by front face 24 of microelectronic element 22, and first surface 34 of dielectric layer 32. Redistribution circuitry includes a plurality of redistribution contacts 38 with faces 39 exposed on unit 20 for connection to another structure. Redistribution contacts are electrically connected to contacts 26 of microelectronic element 22 by a plurality of traces 36. In the embodiment shown in FIG. 1, traces 36 and redistribution contacts 38 are disposed along common surface 40. A redistribution dielectric 72 can be formed along common surface 40 with redistribution contacts 38 and traces 36 exposed at a face thereof and can fill spaces between traces 36 and contacts 38 that are disposed along surface 40 or can be formed along substantially all or surface 40 such that traces 36 and contacts 38 are spaced apart from surface 40. In such an embodiment, traces 36 and redistribution contacts 38 can be formed on a surface of redistribution dielectric 72 or can be embedded therein, and traces 36 can be connected to contacts 26 of microelectronic element 22 by depositing metal into holes formed in the dielectric layer in an area overlying contacts 26. Such a redistribution dielectric can be made of any suitable dielectric material, including a layer of flexible material, such as a layer of polyimide, or other dielectric material of the commonly used for making tape automated bonding ("TAB") tapes.

Redistribution circuitry can be used to position the redistribution contacts 38 in an area where they can be connected to another structure to form at least a part of an electric connection between the contacts 26 of microelectronic element 22 and another microelectronic structure, such as a circuit panel or the like, that has contacts in a different configuration than that of contacts 26. As such, redistribution contacts 38 can be formed in an array that is different than that of contacts 26 and that can correspond to an array of a structure to which package 10 is to be mounted. As shown in FIG. 1, the array of redistribution contacts 38 can include some redistribution contacts 38 that overlie microelectronic element 22 and other redistribution contacts 38 that overlie first surface 34 of encapsulation layer 32. The array of redistribution contacts 38 can include a number of rows and columns that include contacts 38 within either of the above areas. Although a single row is shown in FIG. 1, additional rows can be present throughout unit 20, either inside or outside of the rows shown. The arrangement in which some of the redistribution contacts 38 overlie encapsulation layer 32 can also be referred to as a "fan-out" portion of the redistribution circuitry. Further, wafer-level packages including redistribution circuitry having such a fan out portion can be referred to as "fan-out" wafer level packages.

Microelectronic unit 20 is mounted on a substrate 50 that includes a dielectric layer 52. Dielectric layer 52 has a first surface 54 and a second surface 56. In the embodiment of FIG. 1, microelectronic unit 20 is mounted on substrate 50 such that the front face 2 of microelectronic element 22 faces first surface 54 of dielectric layer 52. Dielectric layer 52 can be made from an insulating material such as polyimide or another material suitable for encapsulation layer 32 as described above. In an embodiment, dielectric layer 52 can be made from a material having a relatively low coefficient of thermal expansion ("CTE") such as of less than 10 parts-per-million per degree Celsius ("ppm/° C."). Further the CTE can be less than 8 ppm/° C. A dielectric layer 52 having such a CTE can be made from a material such as: low temperature co-fired ceramic, liquid crystal polymer, glass, and high filler-content epoxy.

Figure 5:
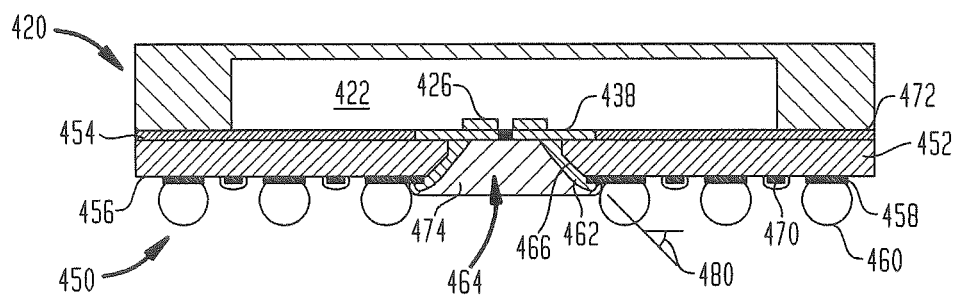
FIG. 5 shows an alternative embodiment of a microelectronic package.

Substrate 50 includes a plurality of electrically conductive terminals 58 exposed at second surface 56 of dielectric layer 52. Terminals 58 are configured for connection to another microelectronic device or structure such as a circuit panel, a printed circuit board ("PCB") or the like. Such a connection can be achieved, for example, by joining solder balls 60 to terminals 58, such as on front face thereof. As shown in FIG. 1, terminals 58 can substantially align, at least along a portion thereof, with redistribution contacts 38 such that package 10 can connect to, for example, a PCB having contacts 88 in an array matching that of redistribution contacts 38, as discussed above. In another embodiment, such as that which is shown in FIG. 5, terminals 58 can be in locations that can be different from those of the redistribution contacts 38.

A plurality of conductive interconnects 62 can be at least a portion of an electrical connection between terminals and redistribution contacts 38. As shown in FIG. 1, conductive interconnects 62 are formed in openings 64 in substrate 52 that extend therethrough from first surface 54 to second surface 56 defining an edge surface 66 therein. Conductive interconnects 62 can be made from a conductive matrix material or another conductive material or structure. Openings can be formed corresponding to aligning pairs of terminals 58 and redistribution contacts 38 such that they form an axis substantially perpendicular to surfaces 54 and 56 and further such that the contact 38 and terminal 58 in such a pair overlie at least a portion of the respective opening 64. Accordingly, an interconnect 62 within such an opening 64 can extend all the way therethrough and connect to a respective terminal 58 and contact 38 to achieve an electrical connection therebetween, as shown in FIG. 1. Interconnects 62 can substantially fill openings 64, extending along edges 66 thereof. Alternatively, openings 64 can overlie or be adjacent to a portion of an additional conductive feature formed along second surface 56, such as a trace or the like that is electrically connected to a respective terminal 58 remote from the opening 64.

Microelectronic unit 20 can be mounted on substrate using an adhesive layer between common surface 40 and first face 54 of dielectric layer 52 or between a surface of redistribution dielectric 72 and first face 54 or dielectric layer 52, depending on the particular structure used.

All of the structures present in microelectronic package 10 have their own coefficient of thermal expansion ("CTE"), meaning that they expand and contract in response to changes in temperature by varying amounts. In many applications of packaged microelectronic elements, for which microelectronic package 10 can be suited, the temperature of the package undergoes frequent, if not constant, heat cycling due to changes in the current flowing therethrough. Accordingly, frequent changes in size of the structures of packaged microelectronic elements are common. In forms of wafer-level packaging that lack the substrate, as shown in the Figures of the present disclosure, redistribution contacts can be used directly for attachment to a PCB or the like using, for example, solder balls. Failure of solder joints can be particularly problematic, and likelihood of such failure can increase when a contact is formed near or overlying the interface between an encapsulant and a microelectronic element. Failures of the type described have limited the size of microelectronic elements and of redistribution layer arrays because the effect of different CTE is dependent on the size of the elements. Accordingly, the effects have been reduced by keeping size small. Additional failures within such structures are also possible due to changes in relative sizes of the elements due to heat cycling, and can include delamination of the various structures, such as the encapsulant from the microelectronic element or of the encapsulant from the redistribution circuitry or an associated substrate. By providing substrate 50 for mounting of microelectronic unit 20 thereto, which allows the use of terminals 58, remote from contacts 26, for connection to an outside structure via interconnects 62, the effects of heat-cycling can be reduced. For example, by using a compliant material for dielectric layer 52, substrate 50 can bend, flex, stretch or compress to accommodate for a change in size of portions of microelectronic unit 20 or movement of contacts 38 resulting therefrom. This accommodation can make terminals 58 less likely to shift in position during heat cycling, thereby potentially reducing failure of the bond interfaces. The use of a compliant dielectric layer 52 can also reduce stresses elsewhere in package 10, for example those caused by changes in the size of solder balls 60 during heat cycling. In some embodiments, a conductive material matrix having compliant properties can be used to form interconnects 62, which can work in connection with a compliant dielectric layer 52 to further reduce such stresses.

Figure 2:
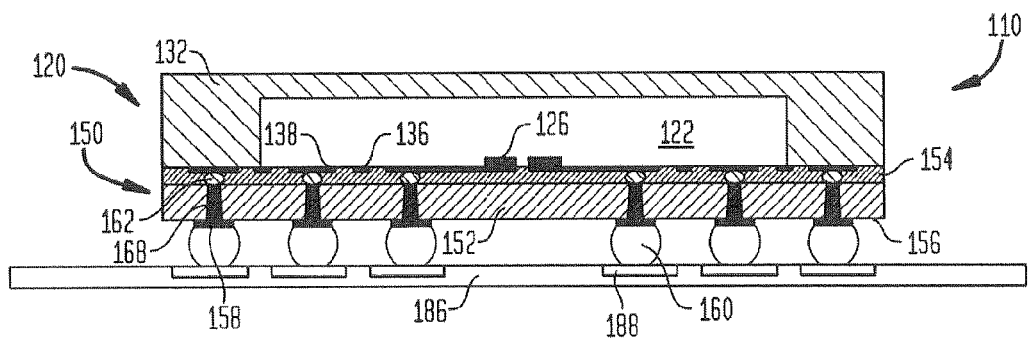
FIG. 2 shows an alternative embodiment of a microelectronic package assembled on a circuit panel.

FIG. 2 shows an embodiment of a microelectronic package 110 that is similar to that which is shown in FIG. 1. Terminals 158 of package 110, however further include a rigid interconnect portion 168 extending from the back faces 157 thereof in an arrangement that can be achieved by, for example tape-automated bonding ("TAB"). Rigid interconnect portions 168 can extend at least partially through respective ones of openings 164 to ends 169 thereof that are remote from back faces 157. In an embodiment, rigid interconnect portions 168 can be integrally formed with terminals 158 of the same material, including gold, copper, nickel, aluminum or combinations thereof. In another embodiment, rigid interconnect portions 168 can be formed from a separate element and bonded to faces 157 such as through solder, plating or the like.

Conductive interconnects 162 can then join to end surfaces 168 at one end and to redistribution contacts 138 at the other. Conductive interconnects 162 can be formed from deposited solder masses, conductive paste, or a conductive matrix material. In an embodiment, rigid interconnect portions can fill the entire distance of opening between faces 154 and 156. In such an embodiment, the interconnects 162 can be formed outside of the substrate and connecting to the end surfaces and the contacts with a dielectric layer or underfill filling the spaces between the interconnects. In the embodiment shown, an underfill layer 178 can be formed bonded to surface 140 and first surface 54 of dielectric layer 152 and filling any space therebetween that results from the height of conductive interconnects 162 above surface 154, for example. Underfill layer 178 can also fill spaces between conductive interconnects 162, contacts 138, traces 136, or any other element between surfaces 140 and 154. Underfill layer 178 can be made from a dielectric material, including a resin or other curable material that can, for example, be injected between surfaces 140 and 154 in a flowable state and then substantially solidify. In other embodiments, end surfaces 168 or rigid interconnect portions 158 can be spaced above or below surface 154. Accordingly, interconnects 162 can fill the remaining portion of opening 164 not filled by rigid interconnect portion 168 or can cover any exposed portion of rigid interconnect portions 158 above surface 154.

Figure 3:
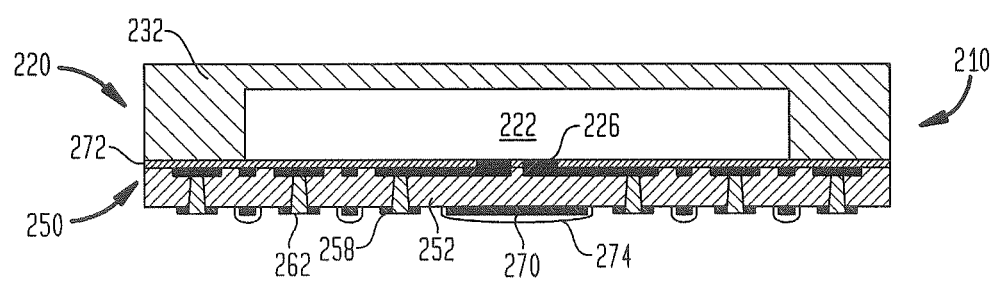
FIG. 3 shows a further alternative embodiment of a microelectronic package assembled on a circuit panel.

As shown in FIG. 3, an additional routing layer can be formed on surface 256 of dielectric layer 152 in the form of traces 270 and contacts 276. The traces 270 can connect terminals 258 to each other or can connect terminals 258 to contacts 276 for connection to an outside element. In an embodiment, the routing layer can also include a ground plane (not shown). An encapsulant 274 can further be formed over the traces, for example, to provide protection therefore.

Figure 4:
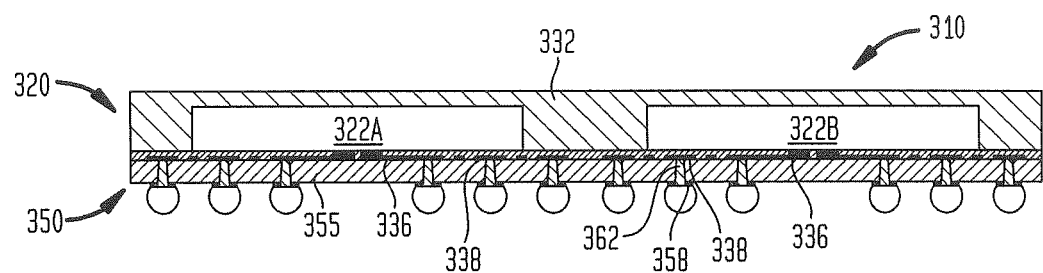
FIG. 4 shows a microelectronic package including multiple microelectronic elements in accordance with a further embodiment of the present disclosure.

FIG. 4 shows a variation of a microelectronic package 310 wherein microelectronic unit 320 includes first and second microelectronic elements 322A and 322B. Further variations can include additional microelectronic elements using a structure similar to that of FIG. 4 in which the microelectronic elements can be arranged in an array of rows and columns thereof. Contacts 326 of microelectronic elements 322A, 322B can electrically connect to an outside element through redistribution circuitry and through interconnects 362 using terminals 358, as described with respect to FIG. 1. Further, traces 336 within the routing circuitry can connect to redistribution contacts 338 that are remote from the respective microelectronic element 322A or 322B and can further be in the area of or beyond the other microelectronic element. Additionally, conductive features in substrate 50 can be used to electrically interconnect microelectronic elements 322A and 322B. For example, traces (not shown in FIG. 4) can be formed extending along second surface 365 of dielectric layer 352 between terminals 358 that are connected by interconnects 362 to redistribution contacts 338, which are, in turn connected to respective ones of the microelectronic elements 322A and 322B. Additionally, substrate 352 can have a structure similar to that of the interconnection substrate having multiple dielectric layers having traces extending laterally therealong between interconnects, as described in co-pending, commonly assigned U.S. patent application Ser. No. 13/092,376, the entire disclosure of which is incorporated by reference herein.

Figure 6:
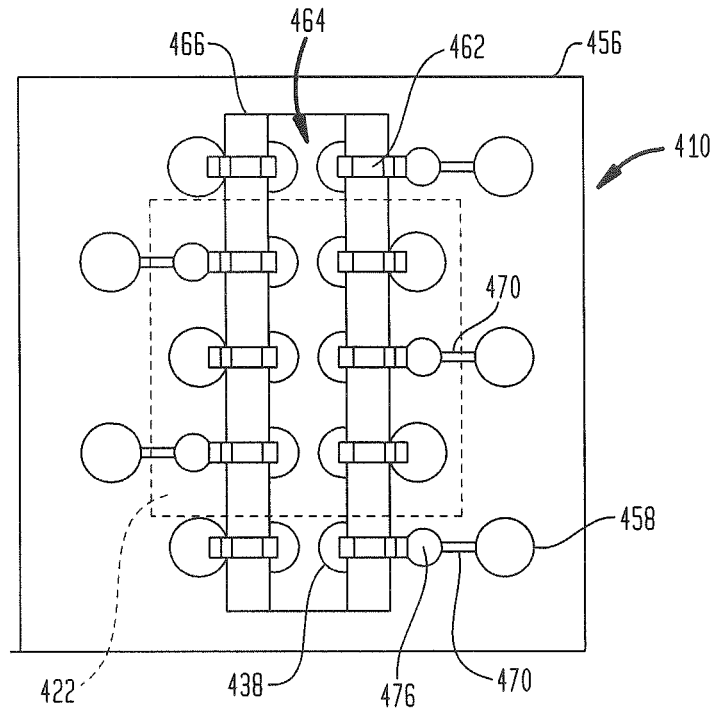
FIG. 6 shows a bottom plan view of the package shown in FIG. 5.

A further alternative embodiment of a microelectronic package 410 is shown in FIG. 5. In this embodiment, a microelectronic unit that can be similar to that which is described above with respect to FIG. 1 or can be in the form of another fan-out wafer level package, is mounted on a substrate 450. Substrate 450 includes a dielectric layer 452 that can be made of a similar material as described above. Dielectric layer terminals 458 are formed on second surface 456 and first surface 454 faces microelectronic unit 420. In this embodiment, dielectric layer 452 includes a single opening in the form of a window 464 having edges 466 that are angled with respect to second surface 456 at least along a portion thereof. Window 464 is open in an area that overlies at least portions of redistribution contacts 438. As shown in FIG. 6, redistribution contacts 438 can extend in a direction along an axis of window 464 that is into and out of the page with respect to the view shown in FIG. 5. A plurality of conductive interconnects 462 extend along edge 466 of window 464 from at least portions of redistribution contacts 438 to terminals 458 or to traces 470 that are connected to terminals 458 for completing an electrical connection between terminals 458 and contacts 426 of microelectronic element 422. Interconnects 462 can be made from a conductive matrix material, as described above. Further, edges 466 of window 464 can be angled along at least a portion thereof with respect to second surface 456 such that the conductive matrix material can be deposited in a sintered state along the edge 466 and to minimize movement along edge 466 due to gravity before curing of the matrix material. Such an angle 480 can be between about 15° and 75°. In a further embodiment, angle 480 can be between about 20° and 45°. Alternatively, angle 480 can be near 90°.

In a variation of the embodiment shown in FIGS. 5 and 6, a plurality of windows can be formed in the dielectric layer that correspond to and extend in the general direction of rows of redistribution contacts formed in an array on the microelectronic unit. In such a variation, terminals can be formed on portions of the second surface of the substrate between the windows.

Figure 7:
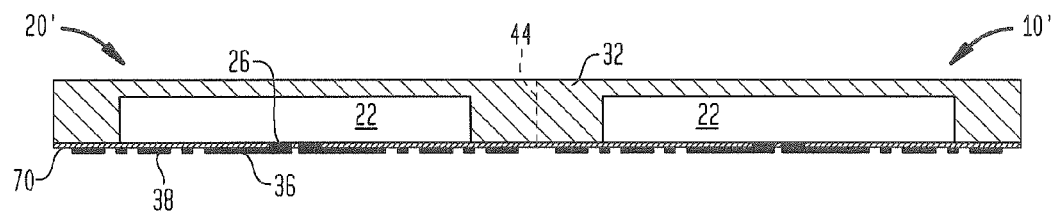
FIGS. 7-9 show a microelectronic unit during successive steps of a method of formation thereof.
Figure 8:
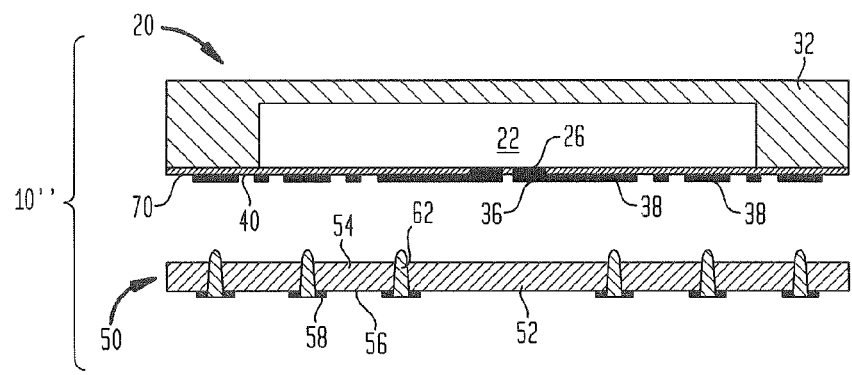
Figure 9:
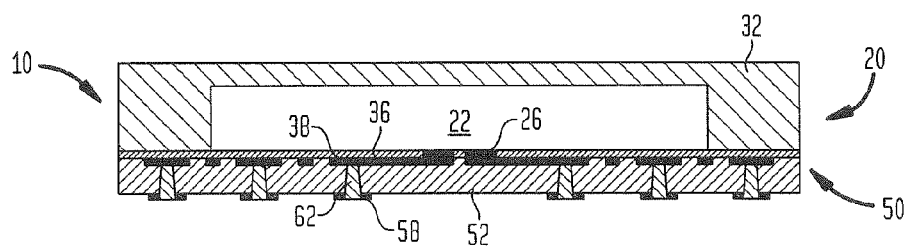

An embodiment of a method for making a microelectronic package 10 in is shown in FIGS. 7-9. In this embodiment, microelectronic unit 20 is initially formed as part of a single in-process unit 20' including a single encapsulant layer 32' that includes multiple microelectronic elements 22 and multiple groups of redistribution circuitry including traces 36 and redistribution contacts 38 formed on a face 40'. The in-process unit 20' is then diced into individual units, including microelectronic unit 20 by cutting along line 44.

Microelectronic unit 20 is then mounted on a substrate 50 that is similar to that which is described above with respect to FIG. 1. Specifically, redistribution contacts are aligned with interconnects 62 that are joined to respective terminals 58 on second surface 56 of dielectric layer 52, as shown in FIG. 8. In this step, interconnects have been formed by depositing masses of a conductive matrix material within holes 64 in substrate 52 in state prior to sintering. The matrix component of the un-sintered conductive matrix material of interconnects 62 can then be cured or at least partially cured such that it is flowable but at least partially retains its shape or position, when deposited.

In a subsequent sintering process (FIG. 9), the microelectronic unit 20 and the substrate 50 are heated to a sintering temperature in which the conductive matrix material undergoes changes which then permanently electrically and mechanically joins the substrate and the microelectronic element together.

As deposited, i.e., before sintering, the conductive matrix material can include particles or flakes of a high melting-point material such as copper or silver, and particles or flakes a low melting-point material, such as tin, bismuth, or a combination of tin and bismuth. Some particles may have a structure which includes metal or non-metal cores, for example, polymer, silica or graphite cores, and a different metal such as a low melting-point metal thereon.

In some examples, the conductive matrix material may include a "reactive" or uncured polymer. After deposition, the structure is subsequently heated to a temperature for sintering the conductive matrix material. During this sintering process, the high and low melting point metals fuse together, typically forming intermetallics therebetween, and forming a solid matrix of metal which can have an open cell foam-like appearance. The deposited conductive matrix material may include a medium which escapes from the metallic component thereof during the sintering process, such as by evaporation, such that the conductive matrix material may have voids therein. Alternatively, the conductive matrix material may include a reactive polymer component. Typically, the polymer component cross-links and cures as a result of the sintering process. The polymer component can become interspersed throughout the metal matrix as a result of the sintering process, the polymer material typically being connected together in open cells of the metal matrix. The metal matrix and polymer interspersed throughout may then form a solid conductive structure.

Under certain conditions, after sintering, the conductive matrix material forms a solid structure which subsequently cannot be reflowed except at a temperature substantially higher than the temperature at which the sintering process is performed. Such result may be obtained by sintering particularly when a low melting-point metal, e.g., tin or bismuth, is substantially consumed in the formation of intermetallics with at least one other metal component, of the conductive material, e.g., copper.

Depending upon the application, the temperature at which the conductive matrix material is sintered can be substantially lower than a reflow temperature at which alternative connections made of solder would need to be formed. Metals, e.g., copper, silver added to solder to improve mechanical resilience can increase the melting-temperature of the solder. Thus, the structure herein of conductive redistribution contacts 38 and interconnects 62 of a conductive matrix material thereon may provide a more mechanically robust system with a lower joining temperature than corresponding solder connections.

In such case, use of such conductive matrix material can help to avoid problems associated with higher temperature joining processes. For example, lower temperature joining processes achieved using a conductive matrix material can help avoid undesirable changes in substrates which include organic materials whose glass transition temperatures are relatively low. Also, lower temperature joining processes may help to address concerns during such joining processes relating to differential thermal expansion of the substrate relative to the microelectronic element. In this case, a lower temperature joining process can lead to improved package reliability since reduced thermal excursion during the joining process can lead to less stresses being locked into the assembled microelectronic package. Thus, the microelectronic package has less built-in stresses. In other words, the process described above decreases the internal stress during reflow because the substrate expands less.

In a particular example, the conductive matrix material may include a fluxing component as deposited. The fluxing component can assist in removing oxidation byproducts during the sintering process.

In one embodiment, the joining process can be conducted using a conductive matrix material that does not have a fluxing component. In such case, the joining process may be performed in a low pressure, e.g., partial vacuum, environment, or one in which oxygen has been evacuated or replaced with another gas.

Use of a conductive matrix material to form interconnects 62 to electrically connect the substrate 50 with the microelectronic unit 20 may help achieve particular results. The conductive matrix material can be applied without applying high forces to the contacts and conductive elements which are common in wire-bonding and lead-bonding operations.

The deposition of the conductive matrix material in a viscous phase and the subsequent fusing of the material to the contacts and conductive elements during fabrication can result in the conductive interconnects having greater surface area in contact with the contacts and conductive elements than is common with wire bonds and lead bonds. As a result of the sintering process, the conductive matrix material can wet the contacts 38, and surface tension between the conductive matrix material and the contacts 38 can cause the material to spread over a greater surface area of the contacts, or to spread over entire surface areas of the contacts. This contrasts with direct wire-bonding and lead-bonding operations wherein the bonded wires or leads typically do not contact entire surface areas of contacts, e.g., bond pads. These characteristics of the conductive matrix material may help to reduce the incidence of defects in the conductive connections within assemblies or packages.

Conductive matrix material can be applied to the metal dielectric layer 52 in many different ways to form conductive interconnects 62. A transfer printing process involves providing a mandrel having grooves that correspond to the positions of the conductive interconnects. The grooves can be filled with material and a transfer tool, such as compliant pad, is applied to the mandrel such that material shifts onto the surface of the transfer tool. The transfer tool is then applied to the substrate such that the material is deposited at the appropriate locations to form masses of the conductive matrix material. An inkjet process of spraying atomized material, including silver or copper nanoparticles, can be used to form the masses of conductive matrix material. Other methods of forming the masses of the conductive matrix material can include dispensing, stenciling, screen printing, or laser printing, among others.

After the above-described structure is formed, the microelectronic unit 20 is mated with the substrate 50 such that the interconnects 62 of the conductive matrix material are aligned with respective contacts 38 of the microelectronic unit 20. An adhesive, which can be a compliant adhesive including, for example, silicone, can bond the substrate 50 to surface 40 of the microelectronic unit 20. Alternatively, the dielectric layer 52 of substrate 50 can include a B-staged material including a not fully cured polymer which may directly bond the dielectric element to the face of the substrate. Alternatively, an underfill layer (such as layer 178 in FIG. 2) can be formed between surface 40 and first surface 54, filling gaps between traces 36 and contacts 38 and any space between surface 40 and first surface 54.

Subsequently, the microelectronic unit 20 with the substrate 50 attached thereto can be heated to a sintering temperature which then sinters the conductive matrix material of interconnects 62 and forms a permanent electrical and mechanical connection between the contacts 38 of the microelectronic unit 20 and the corresponding terminals 58 of substrate 50. Joining units, such as solder balls 60 (FIG. 1), can then be attached to terminals 58.

Figure 10:
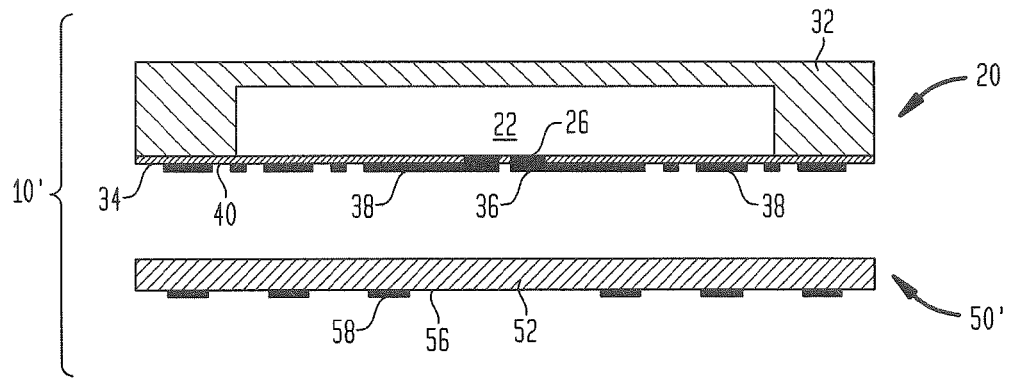
FIGS. 10-12 show a microelectronic unit during successive steps of an alternative method of formation thereof.
Figure 11:
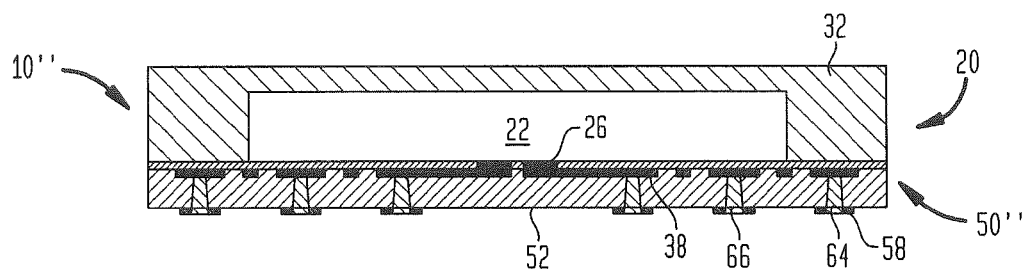
Figure 12:
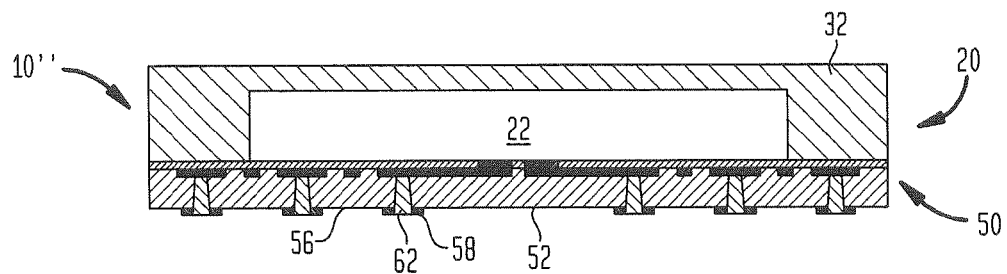

In an alternative method shown in FIGS. 10-12, a microelectronic unit 20 similar to that which was previously described is aligned with a substrate 50' for mounting thereto. In such an embodiment, substrate 50' has terminals on second surface 56 thereof that can be substantially aligned with redistribution contacts 38 on unit 20.

Unit 20 is then mounted on substrate 50' using an adhesive or an underfill layer, as described with respect to FIG. 8. Holes 64 are then formed in substrate 50' through terminals 58 and through dielectric layer 50 such that at least portions of contacts 38 are exposed at second surface 56 of substrate 52. Holes 64 can be formed by drilling, laser etching, or similar means. Masses of a conductive matrix material are then deposited into holes 64, which can be done according to the procedures described above. The conductive matrix material of interconnects 62 can then be cured, for example, by application of heat thereto to fix conductive interconnects 62 and to complete the interconnection of terminals 58 to contacts 26.

In a variation of the method described with reference to FIGS. 10-12, holes 64 can be formed in a variation of substrate 50' that does not include terminals 58. Interconnects 62 can then be formed in holes and joined to respective ones of contacts 38. After formation of interconnects 62, terminals 58 can be formed on second surface 56 over and joined to interconnects 62, along with any associated routing circuitry. This can be done by plating a metal layer thereto and patterning to form the desired conductive features or by transferring features pre-formed on a carrier to second surface 56.

Figure 13:
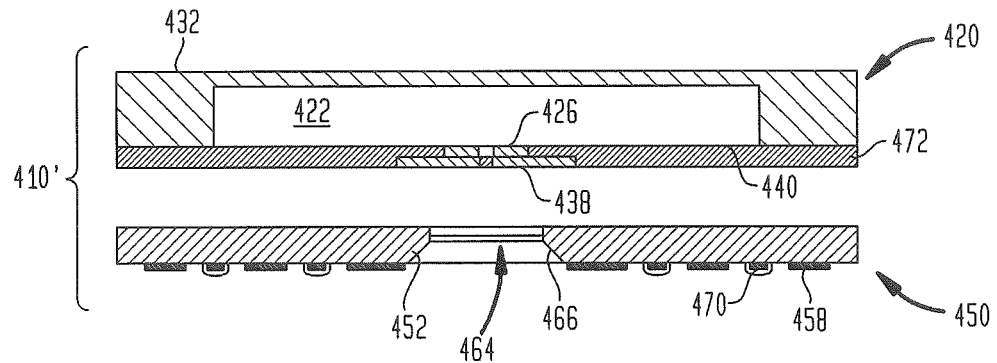
FIGS. 13-15 show an alternative microelectronic unit during successive steps of a method of formation thereof.
Figure 14:
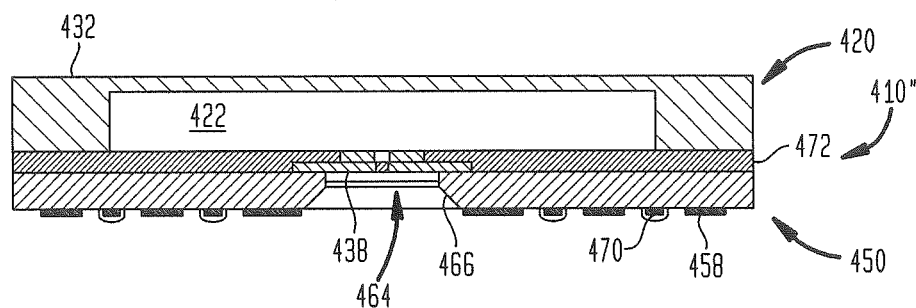
Figure 15:
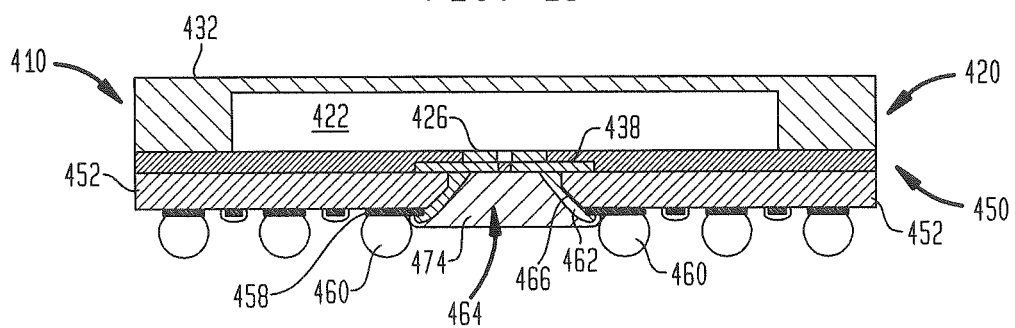

FIGS. 13-15 show a method for making a microelectronic package 410 according to an alternative embodiment. In such an embodiment a microelectronic unit 420, similar to that which was discussed above with respect to FIG. 4 is aligned with a substrate 450, as shown in FIG. 10. Substrate 450 includes an opening in the form of a window 464 having at least partially angled edges 466 of a similar structure described with respect to FIG. 4. Contacts 438 of unit 420 are aligned with window 464 such that at least portions thereof are exposed at second surface 456 by window 464.

As shown in FIG. 14, unit 420 is then mounted on substrate 450, for example, using an adhesive to bond surface 440 of dielectric layer 442 to first surface 454. In FIG. 15, interconnects 462 are formed extending from respective contacts 438 along edge 466 of window 464 and into contact with terminals 458 or traces 470 connected with terminals 458 to complete an electrical interconnection from terminals 450 to contacts 426. An encapsulant 474 can then be formed over interconnects 62 and filling the remainder of window 464.

In a variation of the method of FIGS. 13-15, the microelectronic unit can be mounted on a variation of the substrate described before formation of the window. The window can then be formed in the dielectric layer using chemical or mechanical etching, such as by using a chemical etchant or using lasers. The conductive interconnects can then be formed as described above.

Figure 16:
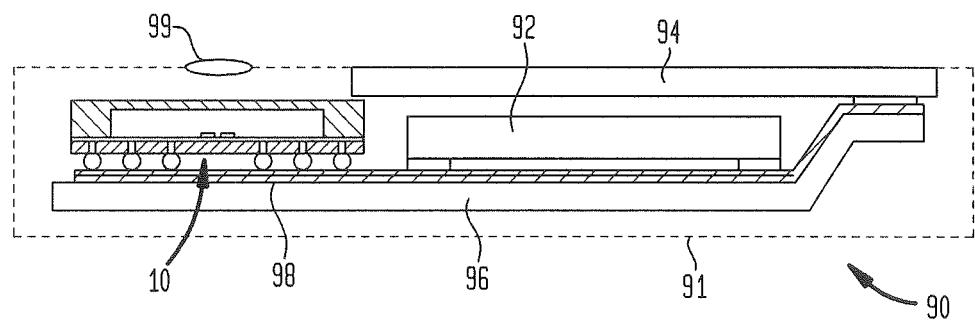
FIG. 16 shows an electronic system including the microelectronic package of FIG. 1.

Microelectronic assemblies described above can be utilized in construction of diverse electronic systems, as shown in FIG. 16. For example, a system 90 in accordance with a further embodiment of the invention can include a microelectronic package 10, similar to the microelectronic package 10 shown in FIG. 1. The embodiment shown, as well as other variations of the package, as described above, or assemblies thereof can be used in conjunction with other electronic components 92 and 94. In the example depicted, component 92 can be a semiconductor chip or package or other assembly including a semiconductor chip, whereas component 94 is a display screen, but any other components can be used. Of course, although only two additional components are depicted in FIG. 16 for clarity of illustration, the system may include any number of such components. In a further variant, any number of microelectronic assemblies including a microelectronic element and an interconnection component can be used. The microelectronic assembly and components 92 and 94 are mounted in a common housing 91, schematically depicted in broken lines, and are electrically interconnected with one another as necessary to form the desired circuit. In the exemplary system shown, the system includes a circuit panel 96 such as a flexible printed circuit board, and the circuit panel includes numerous conductors 98, of which only one is depicted in FIG. 16, interconnecting the components with one another. However, this is merely exemplary; any suitable structure for making electrical connections can be used, including a number of traces that can be connected to or integral with contact pads or the like. Circuit panel 96 can have contacts 52 thereon, and can connect to interconnection component 2 using solder balls 32 or the like. The housing 91 is depicted as a portable housing of the type usable, for example, in a cellular telephone or personal digital assistant, and screen 94 is exposed at the surface of the housing. Where structure 90 includes a light-sensitive element such as an imaging chip, a lens 99 or other optical device also may be provided for routing light to the structure. Again, the simplified system 90 shown in FIG. 16 is merely exemplary; other systems, including systems commonly regarded as fixed structures, such as desktop computers, routers and the like can be made using the structures discussed above.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method for making a microelectronic package, comprising:
    assembling a microelectronic unit with a substrate having first and second opposed surfaces and an edge extending therebetween, the substrate having a plurality of terminals thereon configured for electrical connection with at least one external component, the microelectronic unit including a microelectronic element having a front face with contacts thereon and edges bounding the front face, a dielectric region having a first surface substantially flush with the front face and extending away from the edges, conductive traces having portions extending along the front face away from the contacts, at least some of which further extend along the first surface of the dielectric region, and conductive redistribution contacts connected with the traces, at least some of which are disposed on the first surface of the dielectric region; and
    electrically connecting the redistribution contacts and the terminals with a conductive matrix material extending within at least one opening extending through the substrate.

2. The method of claim 1, wherein the at least one opening includes a plurality of openings and the step of electrically connecting includes forming the plurality of openings after assembling the microelectronic unit with the substrate and then depositing the conductive matrix material within the plurality of openings.

3. The method of claim 1, further comprising selecting the conductive matrix such that the selected conductive matrix material is comprised of a high melting point material, a low melting point material, and a polymer.

4. The method of claim 1, further comprising heating the microelectronic unit and the substrate to a sintering temperature.

5. The method of claim 4, further comprising fusing the high and low melting point materials together and forming an intermetallic material therebetween.

6. The method of claim 4, wherein the sintering temperature is substantially lower than a reflow temperature of solder.

7. The method of claim 4, further comprising depositing the conductive matrix material into the at least one opening and curing the conductive matrix material so that the matrix material is flowable and retains at least a portion of its shape when deposited.

8. The method of claim 1, wherein the step of electrically connecting is performed in a low pressure environment.

9. The method of claim 8, wherein the low pressure environment is a partial vacuum.

10. The method of claim 1, further including forming an underfill layer between the front surface of the microelectronic unit and the first surface of the substrate.

11. A method for making a microelectronic package, comprising:
    mounting a microelectronic unit on a substrate having first and second opposed surfaces and having a plurality of terminals configured for electrical connection with at least one external component, the substrate further having conductive interconnects extending between the first and second surfaces thereof and connected with the terminals, the microelectronic unit including a microelectronic element having a front face with contacts thereon and edges bounding the front face, a dielectric region having a first surface substantially flush with the front face and extending away from the edges, conductive traces having portions extending along the front face away from the contacts, at least some of which further extend along the first surface of the dielectric region, and conductive redistribution contacts connected with the traces, at least some of which are disposed on the first surface of the dielectric region, wherein the mounting of the microelectronic unit on the substrate is carried out such that an electrical connection is completed between the redistribution contacts and the terminals.

12. The method of claim 11, wherein the substrate further includes a plurality of apertures extending through the substrate and the conductive interconnects extend within respective ones of the apertures.

13. The method of claim 11, wherein the conductive interconnects include rigid metal structures, and the step of mounting the microelectronic unit includes joining the conductive interconnects with the redistribution contacts using a conductive bonding material.

14. The method of claim 11, further including forming an underfill layer between the front surface of the microelectronic unit and the first surface of the substrate.

15. The method of claim 11, wherein the conductive interconnects are made from a conductive bonding material, and wherein the step of mounting the microelectronic unit on the substrate includes joining the conductive interconnects with the redistribution contacts.

16. The method of claim 15, wherein the conductive bonding material is a conductive matrix material and wherein the joining of the conductive interconnects with the redistribution contacts includes heating the conductive matrix material.

17. The method of claim 11, further comprising selecting the conductive matrix such that the selected conductive matrix material is comprised of a high melting point material, a low melting point material, and a polymer.

* * * * *